United States Patent [19]

Nakagawa et al.

[11] Patent Number: 5,445,491
[45] Date of Patent: Aug. 29, 1995

[54] METHOD FOR MULTICHAMBER SHEET-AFTER-SHEET TYPE TREATMENT

[75] Inventors: Yoshinori Nakagawa; Shinichi Mitani, both of Numazu; Takehiko Kobayashi, Mishima; Takaaki Honda, Yokohama, all of Japan

[73] Assignee: Toshiba Kikai Kabushiki Kaisha, Tokyo, Japan

[21] Appl. No.: 935,287

[22] Filed: Aug. 26, 1992

[30] Foreign Application Priority Data

Aug. 27, 1991 [JP] Japan .................. 3-215576

[51] Int. Cl.6 .................................. B65G 49/07
[52] U.S. Cl. ...................... 414/786; 414/217; 414/222
[58] Field of Search ......... 414/941, 217, 222, 786, 414/935, 939, 940; 204/298.25; 118/719

[56] References Cited

U.S. PATENT DOCUMENTS

| | | | |
|---|---|---|---|
| 4,405,435 | 9/1983 | Tateishi et al. | 414/217 X |
| 4,592,306 | 6/1986 | Gallego | 414/217 X |
| 4,643,627 | 2/1987 | Bednorz et al. | 414/749 X |
| 4,643,629 | 2/1987 | Takahashi et al. | 414/331 |
| 4,795,300 | 1/1989 | Tomaselli et al. | 414/223 X |
| 4,797,054 | 1/1989 | Arii | 414/225 X |
| 4,824,309 | 4/1989 | Kakehi et al. | 414/222 X |
| 4,825,808 | 5/1989 | Takahashi et al. | 414/217 X |
| 4,828,224 | 5/1989 | Crabb et al. | 414/217 X |
| 4,909,695 | 3/1990 | Hurwitt et al. | 414/786 X |
| 4,917,556 | 4/1990 | Stark et al. | 414/222 X |
| 4,923,584 | 5/1990 | Bramhall, Jr. et al. | 414/225 X |
| 4,951,601 | 8/1990 | Maydan et al. | 414/217 X |
| 4,962,726 | 10/1990 | Matsushita et al. | 414/217 X |
| 4,990,047 | 2/1991 | Wagner et al. | 414/226 X |
| 5,067,218 | 11/1991 | Williams | 414/221 X |
| 5,076,205 | 12/1991 | Vowles | 414/217 X |

FOREIGN PATENT DOCUMENTS

| | | | |
|---|---|---|---|
| 3284541 | 12/1991 | Japan | 414/217 |
| 9104213 | 4/1991 | WIPO | 414/217 |

Primary Examiner—Michael S. Huppert
Assistant Examiner—James T. Eller, Jr.
Attorney, Agent, or Firm—Cushman Darby & Cushman

[57] ABSTRACT

In a multichamber type sheet-after-sheet type of treating apparatus, there are provided an inlet/outlet port capable of independently control pressure and atmosphere in the port, a platform connected to the inlet/outlet port, a plurality of treating chambers connected to the platform, at least two supporting members in the inlet/outlet port for supporting a material to be treated, a hand formed in the platform for supporting the material, and a device for horizontally swinging the hand. In operation, the materials to be treated are treated in the treating chambers at different times, a treated material and a not yet treated material are exchanged between the inlet/outlet port and surrounding air, and one of treating chambers and the platform are interconnected after completion of the treatment for exchanging a treated material and a not yet treated material.

3 Claims, 9 Drawing Sheets

METHOD FOR MULTICHAMBER SHEET-AFTER-SHEET TYPE TREATMENT

BACKGROUND OF THE INVENTION

This invention relates to a method and apparatus for treating materials to be treated, such as semiconductor wafers or the like, for effecting a reduced pressure epitaxial vapor phase growth or etching at a pressure different from the atmospheric pressure and/or in an atmosphere for the purpose of manufacturing semiconductor devices for example, and more particularly, a multichamber sheet-after-sheet type treating method and apparatus for effective treating.

A prior art multichamber sheet-after-sheet type treating apparatus is generally constructed such that a plurality of sheet-after-sheet type radial treating chambers are connected through gate valves to the periphery of a platform of a central chamber or a preparatory chamber.

The interior of the platform is maintained at a pressure or filled with an atmosphere different from the ambient air so that when the treating chamber is opened to the platform, the inside of the treating chamber and materials to be treated would be spoiled with external substances (which will be called particles hereinafter) such as oxygen and dust in the air.

Charging and discharging of the materials to be treated into and out of the treating chamber are performed through an inlet/outlet port connected to the platform via a gate valve and through the platform. More particularly, after inserting the material to be treated into the inlet/outlet port by opening it to the surrounding air, the inlet/outlet port is closed to interrupt the communication with the surrounding air, to make the interior of the inlet/outlet port to be same pressure or atmosphere. Thereafter, the inlet/outlet port and the platform are intercommunicated. Under this condition, a material not yet treated conveyed into the inlet/outlet port is admitted into respective chambers by robots in the platform. At the same time, the material which has been treated in respective treating chambers is returned to the inlet/outlet port.

According to the multichamber sheet-after-sheet type treatment of this type, respective treating chambers are not opened to the surrounding air, and since the platform is always maintained at a predetermined pressure or filled with a predetermined atmosphere, the treatment in the treating chambers can be performed accurately and efficiently so that there is an advantage of effecting at a high efficiency the sheet-after-sheet type treatment accompanying a problem of treating ability. For this reason, as the radius of the wafer of a semiconductor wafer becomes large, in the field of the semiconductor manufacturing apparatus where the batch treatment must be changed to the sheet-after-sheet type treatment, multichamber sheet-after-sheet type treating apparatus have became important.

Multichamber sheet-after-sheet type treating apparatus are classified into a first type wherein the same treatment is performed in parallel in respective treating chambers and a second type wherein different treatments according to a series of manufacturing processes are performed continuously. Respective types are the same in that accurate treatments are made efficiently.

In a prior art multichamber sheet-after-sheet type treating apparatus, for the purpose of increasing treating efficiency, a plurality of materials to be treated is generally inserted into an inlet/outlet port at a time, the inlet/outlet port is opened when the treatments in the treating chambers of all materials thrown into the inlet/outlet port is completed for simultaneously taking out the treated materials, and then the materials to be treated next are again inserted into the inlet/outlet port. More particularly, although the treatments in respective treating chambers are of the sheet-after-sheet type treatment, the insertion and extraction at the treated materials from the inlet/outlet port is of the batch treating type. For this reason, the inlet/outlet port generally contains an elevator which is moved in the vertical direction and supports a plurality of materials to be treated and which is stacked in multiple stages.

However, when the elevator is contained in the inlet/outlet port, the volume of the inlet/outlet port would become large so that it is either necessary to use a large capacity exhaust pump or a long time is necessary for exhausting and for returning to atmospheric pressure, thereby decreasing a percentage of working. Moreover, as a result of throwing in many materials to be treated, the quantity of particles brought into the inlet/outlet port increases and the removal of the particles from the inlet/outlet port is not complete. Moreover, it is not only necessary to prevent the generation of dust as the elevator is moved up and down but also the number of rejects of materials to be treated increases when faults occur in the treating chamber or the like.

Furthermore, it is necessary to interrupt the treatment in the treating chamber when the inlet/outlet port is opened to the atmosphere for exchanging the materials to be treated. For the purpose of exchanging the materials to be treated between the inlet/outlet port and the atmosphere, it is necessary to increase the pressure in the inlet/outlet port to that of the atmosphere, and after replacing the atmosphere in the inlet/outlet port to an atmosphere that can be opened to the surrounding air, the inlet/outlet port is opened to complete exchange of the materials to be treated. Thereafter when the inlet/outlet port is closed again, it is necessary to make the pressure in the inlet/outlet port equal to that of the platform or to the same atmosphere. The interruption time necessary for this operation increases with the volume in the inlet/outlet port.

For this reason, the time required for exchanging the materials to be treated between the inlet/outlet side and the external air causes a great decrease in the operating efficiency of the apparatus so that it is a recent tendency to further increase the number of materials thrown into the inlet/outlet port at the same time.

SUMMARY OF THE INVENTION

Accordingly, it is an object of this invention to provide a novel method and apparatus of a multichamber sheet-after-sheet type treating method and apparatus capable of eliminating the adverse effect of particles, performing accurate treatment at high efficiency and compactly constructing the apparatus.

According to one aspect of this invention, there is provided a sheet-after-sheet- type treating method utilizing a multichamber sheet-after-sheet type treating apparatus including an inlet/outlet port capable of communicating or not communicating with surrounding air through a first gate valve and independently controllable to have a predetermined pressure or atmosphere; a platform connected to the inlet/outlet port via a second gate valve, and capable of independently control a predetermined pressure or atmosphere; a plurality of treating chambers respectively connected to the platform through a third gate valves; and a robot installed in the platform for exchanging materials to be treated between the inlet/outlet port and the respective treating chambers;

the method comprising the steps of treating the materials in respective treating chambers at different times; operating the first gate valve during the treatment in respective treating chambers at least one treated material and a not yet treated material between the inlet/outlet port and the surrounding air; closing the first gate valve for making substantially equal the pressure or atmosphere in the inlet/outlet port to those in the platform; then opening the second gate valve; opening the third gate valves interconnecting either one of the treating chambers and the platform after completion of the treatment in one of the treating chambers for exchanging at least one treated material in the treating chamber and at least one not yet treated material in the inlet/outlet port.

According to another aspect of this invention, there is provided a multichamber type sheet-after-sheet type treating apparatus comprising an inlet/outlet port which is connected to and interrupted from surrounding air through a first gate valve, and can independently control a predetermined pressure and atmosphere in the inlet/outlet port; a platform connected to the side surface of the inlet/outlet port through a second gate valve, and can independently control the predetermined pressure or atmosphere; a plurality of treating chambers connected to the side surface of the platform through third gate valves and can independently control the predetermined pressure or atmosphere; at least two vertically spaced supporting members installed in the inlet/outlet port for supporting the material to be treated; a hand formed in the platform for supporting the material to be treated; means for horizontally swinging the handle in the platform for causing the inlet/outlet port to confront the treating chamber; means for radially moving the handle with respect to the center of the horizontal swing movement; and means for vertically moving the handle.

DESCRIPTION OF THE PREFERRED EMBODIMENTS

Figure 1:
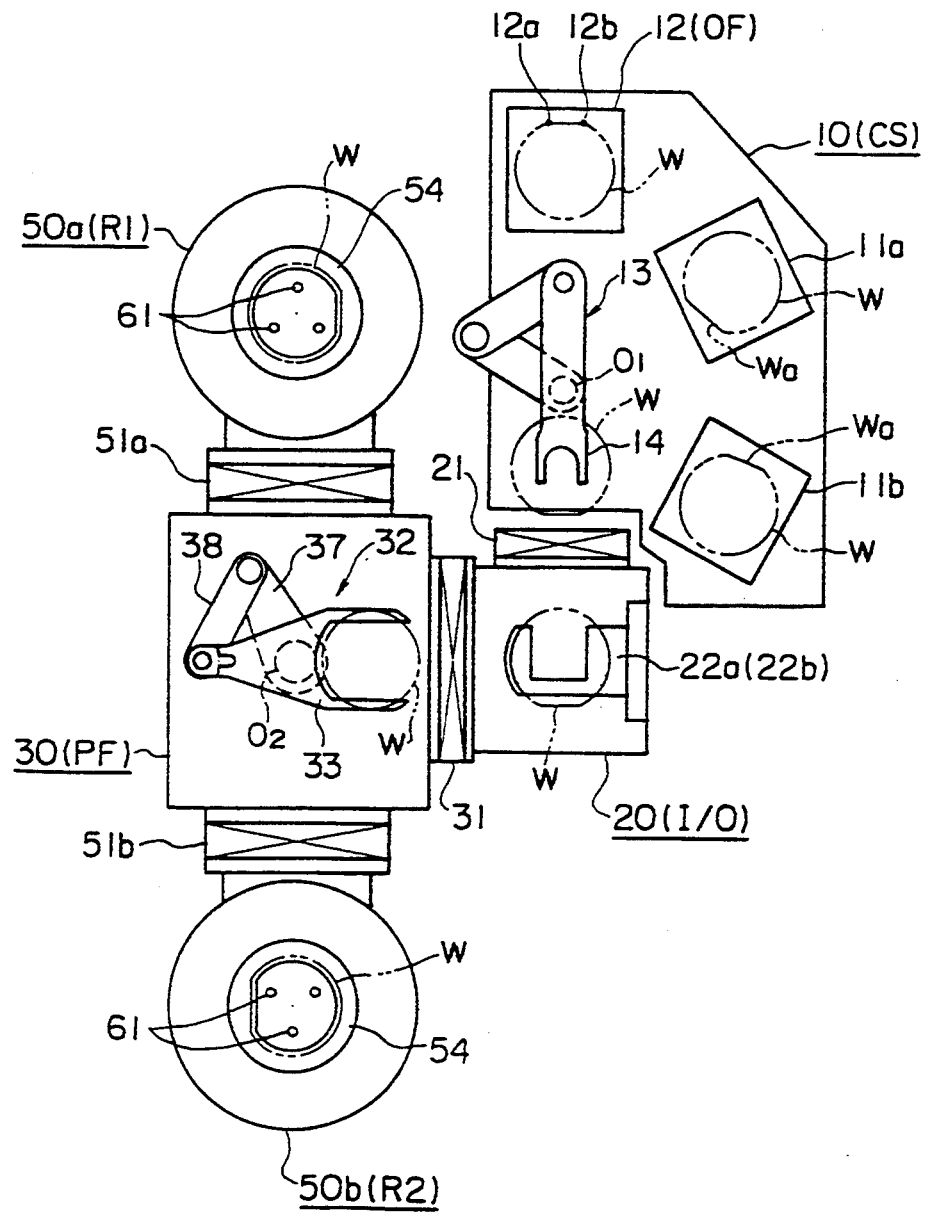
FIG. 1 is a diagrammatic plan view showing one embodiment of the sheet-after-sheet type treating apparatus according to this invention.

Some preferred embodiments of this invention will now be described in detail with reference to the accompanying drawings.

FIGS. 1 through 6 illustrates one example of the multichamber sheet-after-sheet type treating apparatus in which a semiconductor wafer is used as a material to be treated, and a reduced pressure epitaxial vapor phase growth is made on the surface.

As shown, this treating apparatus is mainly made up of a cassette station 10, an inlet/outlet port 20, a platform 30, and a plurality of treating chambers 50a and 50b (only two are shown). On the side surface of the inlet/outlet port 20 on the side of cassette station 10 is provided a first gate valve (i.e., a first inlet/outlet port gate valve) 21. A second gate valve (i.e., a second inlet/outlet port gate valve) 31 is interposed between the inlet/outlet port 20 and platform 30. Furthermore, third gate valves (i.e., corresponding treating chamber gate valves) 51a and 51b are disposed between platform 30 and respective treating chambers 50a and 50b.

As a consequence, the inlet/outlet port 20 is opened to the side of the cassette station 10 on the side of the surrounding air by opening the first gate valve 21. The inlet/outlet port 20 can be hermetically closed by closing the first gate valve 21 and the second gate valve 31. The platform 30 is communicated with the inlet/outlet port 20 by opening the second gate valve 31 and can be hermetically closed by closing the second gate valve 31 and two third gate valves 51a and 51b. Treating chamber 50a or 50b is communicated with platform 30 by opening corresponding third gate valve 51a or 51b. The chamber 50a or 50b is hermetically closed by closing the third gate valve 51a or 51b.

The cassette station 10 is formed with a cassette mounting member which stationary supports cassettes 11a and 11b which contains a plurality of semiconductor wafers (materials to be treated) W in a stacked state (in FIG. 1, the number of the treating chambers 50a and 50b is two). A rotary positioning device 12 including a wafer centering mechanism is also provided for the cassette station 10. The rotary positioning device 12 is a well known orientation flat alignment device. Two sensors 12a and 12b are provided at a position corresponding to a linear orientation flat (orifra) Wa formed on the side of the semiconductor wafer W. The sensors 12a and 12b are used for effecting rotary positioning of the semiconductor wafer W.

At a position on a straight line interconnecting the rotary positioning device 12 and the inlet/outlet port 20 is provided an external robot 13 acting as conveyor means which receives and supplies the semiconductor wafer W between the cassette station 10 and the inlet/outlet port 20.

Figure 2:
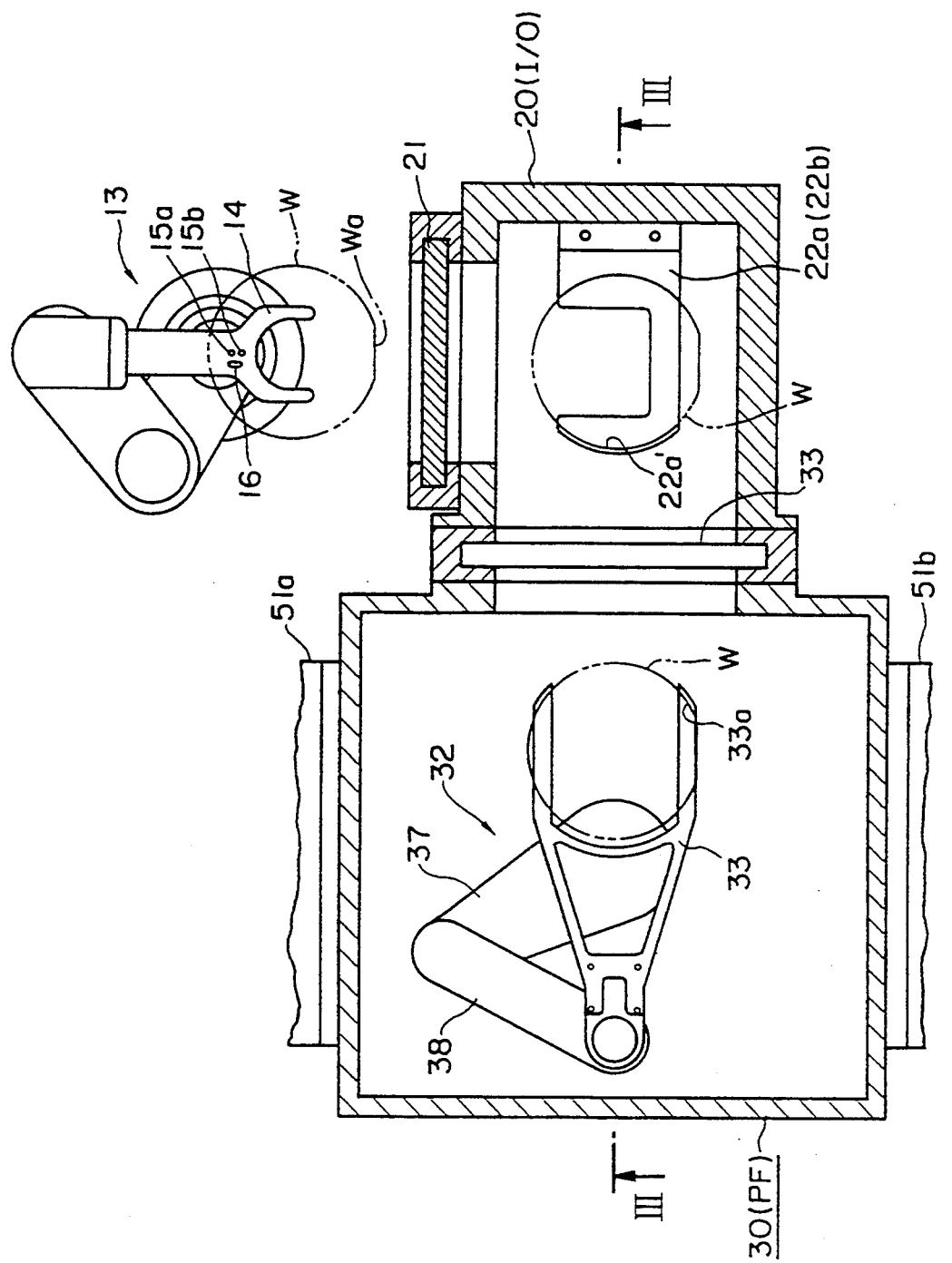
FIG. 2 is an enlarged view showing certain parts shown in FIG. 1.

The arm front end of external robot 13 sucks and holds the lower surface of the semiconductor wafer W. The arm is connected with a hand 14 made of ceramic, for example. As shown in FIG. 2, the hand 14 is provided with two vacuum suction openings 15a and 15b, and is further provided with a photosensor 16 which detects presence or absence of the semiconductor wafer W. The handle 14 is moved in the radial direction (hereinafter, called R direction) with respect to the swinging center $O_1$ (see FIG. 1) and horizontally rotated ($\theta$ movement) about the swinging center $O_1$. Further, the handle 14 is constructed to be movable in the vertical direction (Z movement) with respect to the sheet of drawing.

The moving mechanism of R, $\theta$ and Z movements is identical to that of the following vacuum robot 32 and is therefore not described at this stage of description.

The external robot 13 takes out a not yet treated semiconductor wafer from either one of the cassettes 11a and 11b and conveys the taken out wafer to the rotary positioning device 12 for mounting the wafer thereon. Then after completing the positioning, the external robot 13 conveys the semiconductor wafer W into the inlet/outlet port 20 through the first gate valve 21. Thereafter, the treated semiconductor wafer W contained in the inlet/outlet port 20 is taken out and the wafer W is then admitted into a corresponding cassette 11a or 11b.

Figure 3:
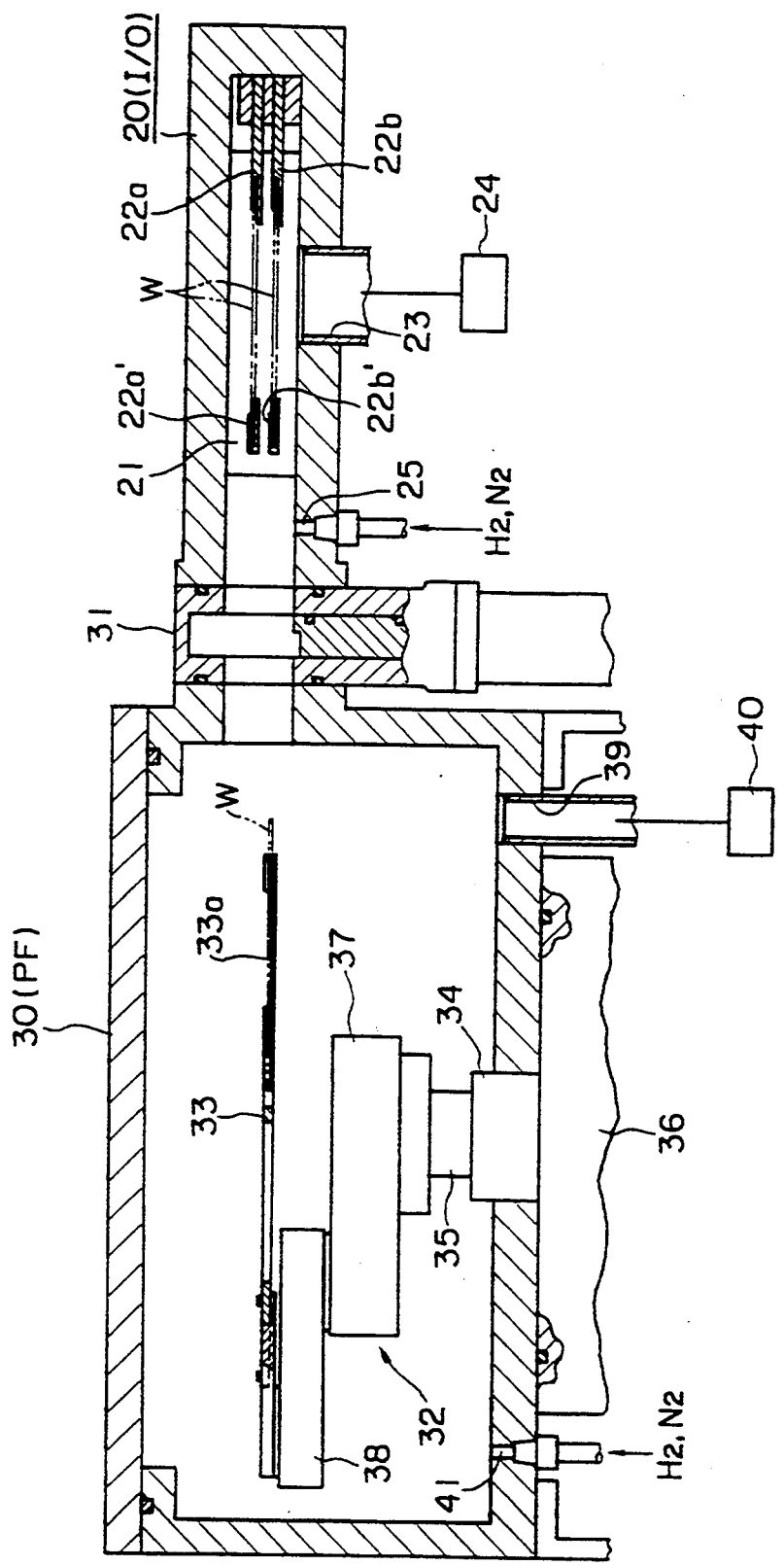
FIG. 3 is a sectional view taken along a line III—III in FIG. 2.

As shown in FIG. 3, within the inlet/outlet port 20 are disposed in parallel two superposed supporting members 22a and 22b which support the lower surfaces of the peripheries of the semiconductor wafers W and made of plate shaped quartz, for example. As a consequence, the upper supporting member 22a supports a not yet treated semiconductor wafer W, whereas the lower supporting member 22b supports an already treated semiconductor wafer W.

On the upper surfaces of respective supports 22a and 22b are formed recesses 22a' and 22b' having the same configuration as that of the semiconductor wafer W for positioning and supporting the semiconductor wafers.

By constructing the inlet/outlet port 20 in a manner as above described, the volume of the inlet/outlet port 20 can be made small, pressure reduction and exchange of gas can be made in a short time, the entire apparatus can be constructed to be compact, and the generation of particles can be eliminated.

As shown in FIG. 3, the inlet/outlet port 20 is connected to a vacuum pump 24 via an exhaust port 23 and is constructed such that hydrogen gas and nitrogen gas can be admitted through an air supply port 25. With this construction, it is possible to hermetically close the inlet/outlet port 20 by closing first and second gate valves 21 and 31, and to independently control the internal pressure and atmosphere through exhaust port 23 and air supply port 25.

A vacuum robot 32 for effecting R, $\theta$ and Z operations similar to the external robot 13 is installed in the platform 30. More particularly the vacuum robot 32 is provided with a handle 33 made of quartz, for example, and having a shape of a fork for supporting the lower surface of the semiconductor wafer W, while in the upper surface of handle 33 is formed a recess 33a having the same configuration as the semiconductor wafer W for positioning the same.

As shown in FIG. 3, a hollow shaft 35 is held in a stationary shaft 34 to be rotatable and movable in the vertical direction. By the driving member 36 of the hollow shaft 35, the hollow shaft 35 is rotated and moved in the vertical direction so that the hollow shaft 34 can rotate ($\theta$ movement) about a center of swinging $O_2$ (see FIG. 1) and can move in the vertical direction (Z movement). By the rotation of a rotary shaft (not shown) disposed in hollow shaft 35, the first and second arms 37 and 38 are caused to approach and separate from each other by pulleys and a timing belt (not shown) so as to radially move (R movement) the hand 32a about the center of swinging $O_2$.

Furthermore, as shown in FIG. 3, the platform 30 is connected to a vacuum pump 40 via an exhaust port 39 and is constructed such that hydrogen and nitrogen gases can be introduced into the platform 30 via gas supply port 41. As a consequence, by hermetically closing the platform by closing the second gate valve 31 and the third gate valves 51a and 51b the platform can be hermetically closed and the pressure and atmosphere in the platform 30 can be controlled independently through exhaust port 39 and gas supply port 41.

While the pressure and atmosphere in the platform 30 are maintained constant, when the pressure and atmosphere in the inlet/outlet port 20 are brought to be equal to those in the platform 30, the second gate valve 31 is opened for intercommunicating the inlet/outlet port 20 and the platform 30. Further, while intercommunicating either one of treating chambers 50a and 50b and the platform 30, the semiconductor wafer W is transferred between the inlet/outlet port 20 and either one of treating chambers 50a and 50b through the platform 30 by the operation of the vacuum robot 32.

The purpose of the treating chambers 50a and 50b is to perform reduced pressure epitaxial growth on the surface of the semiconductor wafer W which is the material to be treated. For example, the semiconductor wafer W is heated to 1100°–1200° C. by an electric heater, not shown, while passing hydrogen gas at a reduced pressure of several tens torr, for example. Thus while controlling the temperature to a predetermined epitaxial growing temperature, and while the reaction gas is passed and the support of the semiconductor wafer W is rotated, silicon layer is epitaxially grown on the surface of the semiconductor wafer.

Figure 4:
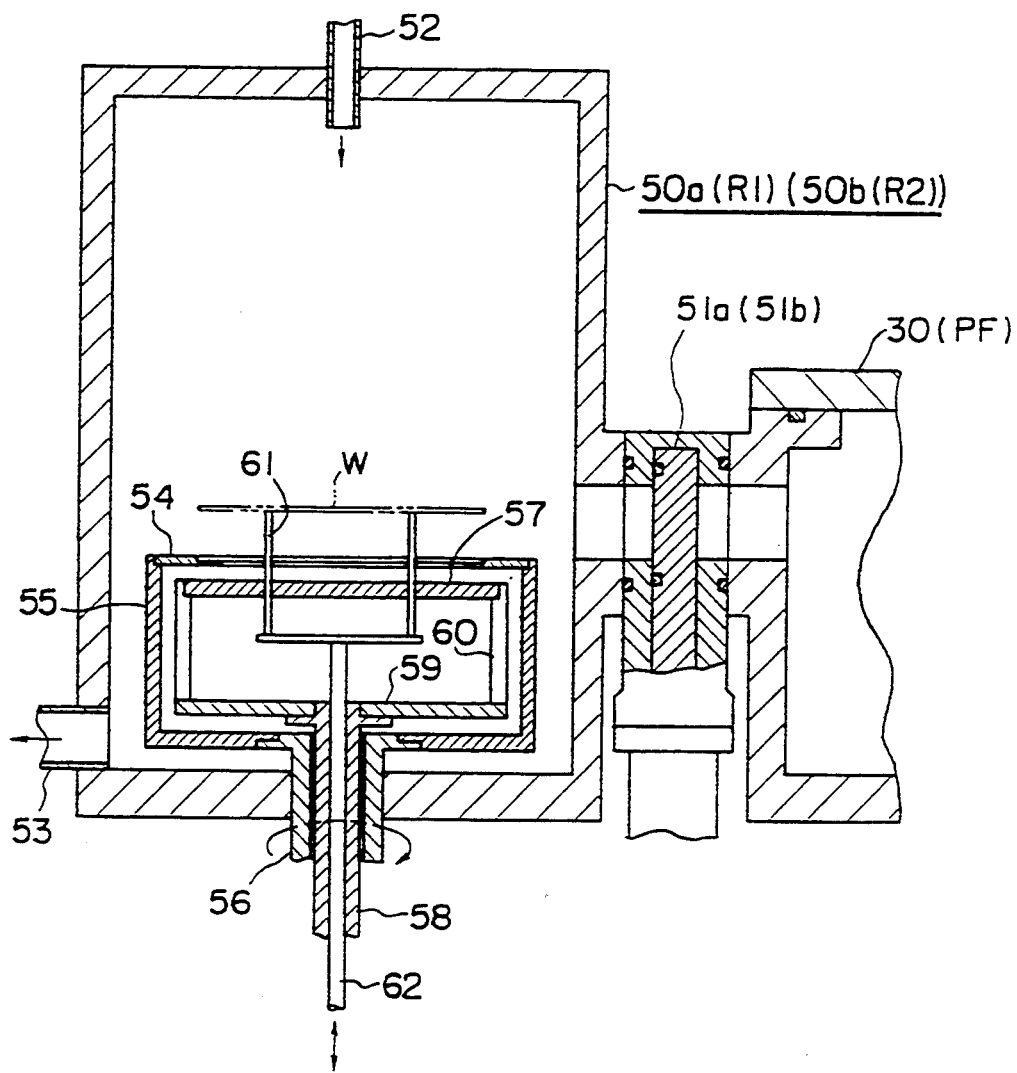
FIG. 4 is a longitudinal front view showing a treating chamber.
Figure 5:
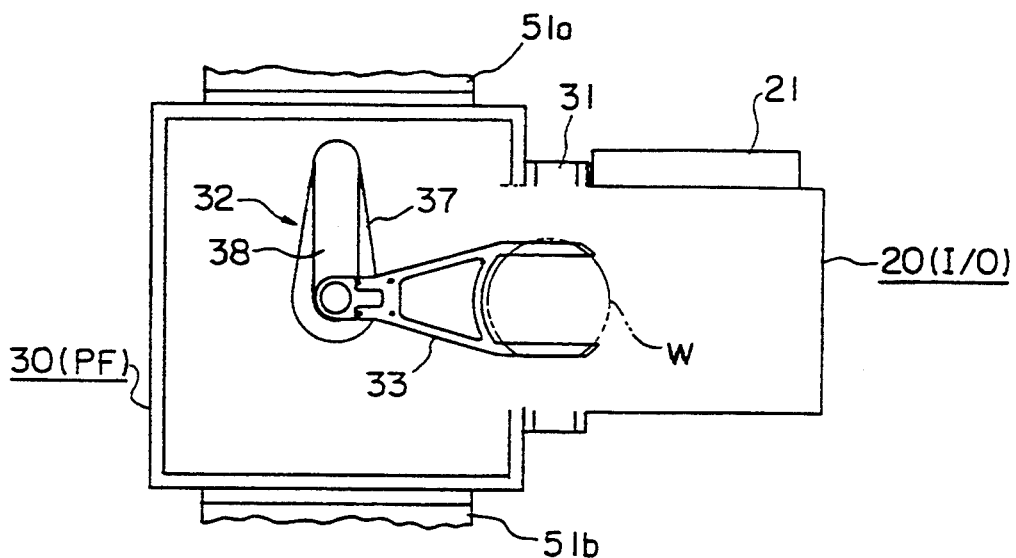
FIG. 5 is a plan view of a vacuum robot during its movement in the direction of R.
Figure 6:
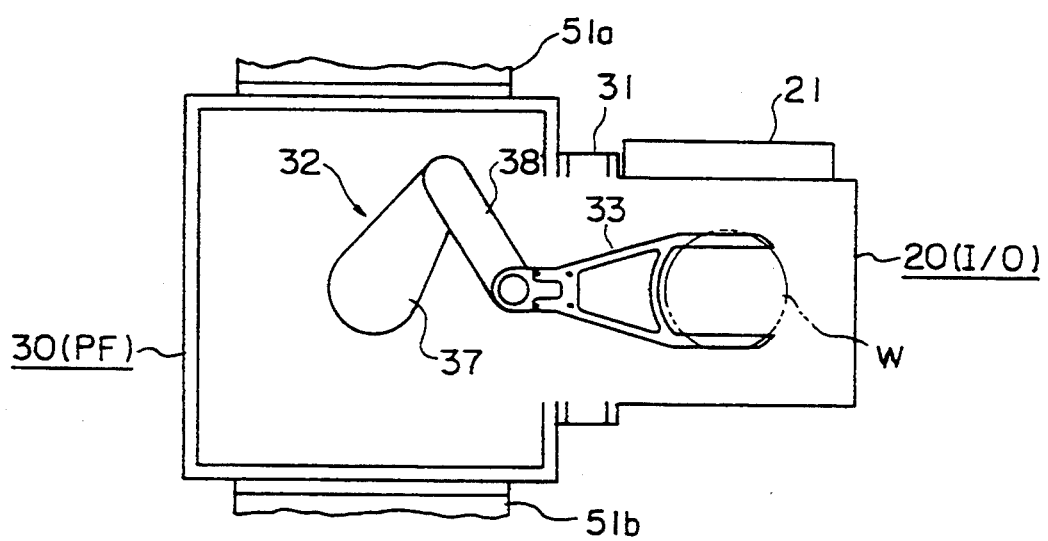
FIG. 6 is a plan view showing the vacuum robot after completion of its movement in the direction of R.

More particularly, as shown in FIG. 4, each one of the treating chambers 50a and 50b is provided with a gas inlet port 52 and an exhaust port 53 so as to independently control the predetermined pressure and atmosphere.

In each of the treating chambers 50a and 50b is disposed a suscepter 54 supporting the semiconductor wafer W on its upper surface. The suscepter 54 is supported by the upper end of the hollow rotary shaft 56 through a holder 55 and driven by a source of drive, not shown.

The hollow rotary shaft 56 supports an encoder, not shown, for determining the rotary position of the suscepter 54 for making it to coincide with the orientation flat Wa of the introduced semiconductor wafer W. An electric heater 57 for heating the semiconductor wafer W is disposed beneath the-suscepter 54. Heater 57 is connected through a plurality of insulating rods 60 to a supporting plate 59 connected to the upper end of a stationary heater supporting shaft 58 inserted in the hollow rotary shaft 56.

Three push up pins 61 disposed in a regular triangular-configuration are provided for the suscepter 54 free to project upwardly. These push up pins 61 are connected to the upper end of a push up shaft 62 disposed in the heater supporting shaft 58 to be movable in the vertical direction.

When moved upwardly these push up pins 61 push away the semiconductor wafer W from the upper surface of suscepter 54, thus enabling a hand 33 of the vacuum robot 32 to hold the semiconductor wafer W.

When the push up pins 60 are lowered, the semiconductor wafer W is mounted on the suscepter 54.

Transfer of the semiconductor wafer W between the platform 30 and treating chamber 50a or 50b effected by the vacuum robot 32 is effected in the following manner. More particularly, after completing the treatment in the treating chamber 50a, the third gate valve 51a installed between the treating chamber 50a and the platform 30 is opened, and then the semiconductor wafer W is exchanged between the treating chamber 50a and platform 30 (with regard to the other treating chamber 50b the same operation is made).

As above described, a not yet treated semiconductor wafer W is admitted into the inlet/outlet port 20 by the operation of the external robot 13. Next, already treated semiconductor wafer W is taken out from the inside of the inlet/outlet port 20. Then the first gate valve 21 is closed to make equal the pressure and atmosphere in the inlet/outlet port 20 and the platform 30. Thereafter, the second gate valve 31 is opened.

Concurrently with the opening of the second gate valve 31, the treatment of the semiconductor wafer in the treating chamber 50a is completed. Then the third gate valve 51a is opened and the three push up pins 61 are elevated to raise the semiconductor wafer W from the suscepter 54. Under these conditions, the vacuum robot 32 is operated for inserting its hand 33 into the lower side of an already treated semiconductor wafer W. Then the push up pins 61 are lowered for mounting the already treated semiconductor wafer W on hand 33. The hand 33 supporting the semiconductor wafer W is subjected to the R motion for transferring the semiconductor wafer W to the platform 30 from the treating chamber 50a. Then the treated semiconductor wafer W is transferred onto the lower support 22b in the inlet/outlet port 20 by respective operations θ, R and Z.

Then after retracting the vacuum robot 32, it is raised, advanced and raised for mounting a not yet treated semiconductor wafer W supported by the upper support 22a in the inlet/outlet port 20. After transportion of this semiconductor wafer W into the platform 30 by the R operation, the wafer W is mounted on the suscepter 54 in the treating chamber 50a by a substantially reverse operation with respect to the operation described above, which is effected by θ and R operations and the upward and downward motions of push up pins 61.

After conveying a not yet treated semiconductor wafer W into the treating chamber 50a, the third gate valve 51a is closed to start the treatment in the treating chamber 50a. On the other hand, the second gate valve 31 is closed and the inside of the inlet/outlet port 20 is returned to the atmospheric pressure by admitting nitrogen gas. Then the first gate valve 21 is opened and the semiconductor wafer W is taken out by the external robot 13.

The conveyance of the semiconductor wafer W by robots 13 and 32 is made at an interval of ½ of the treating time of one treating chamber 50a or 50b because there are two treating chambers. For this reason, so long as the conveyance time during which the pressure of the inlet/outlet port 20 is reduced and the gas therein is exchanged is less than ½ of the treating time, loss of time would not occur.

The epitaxial growth is normally made in 1 to several minutes, although this differs somewhat owing to various conditions including the thickness of the layer formed, the flow quantity of the reaction gas, the number of revolutions of the semiconductor wafer W, etc., which are performed after the temperature of the semiconductor wafer W has been risen to 1,100° or 1,200° C. After the epitaxial growth, hydrogen gas is again passed through the treating chamber for lowering the temperature of the semiconductor wafer W to 200°–300° C., thereby completing the treatment. The treatment time between heating up and cooling down is about 10 minutes, for example.

Figure 7:
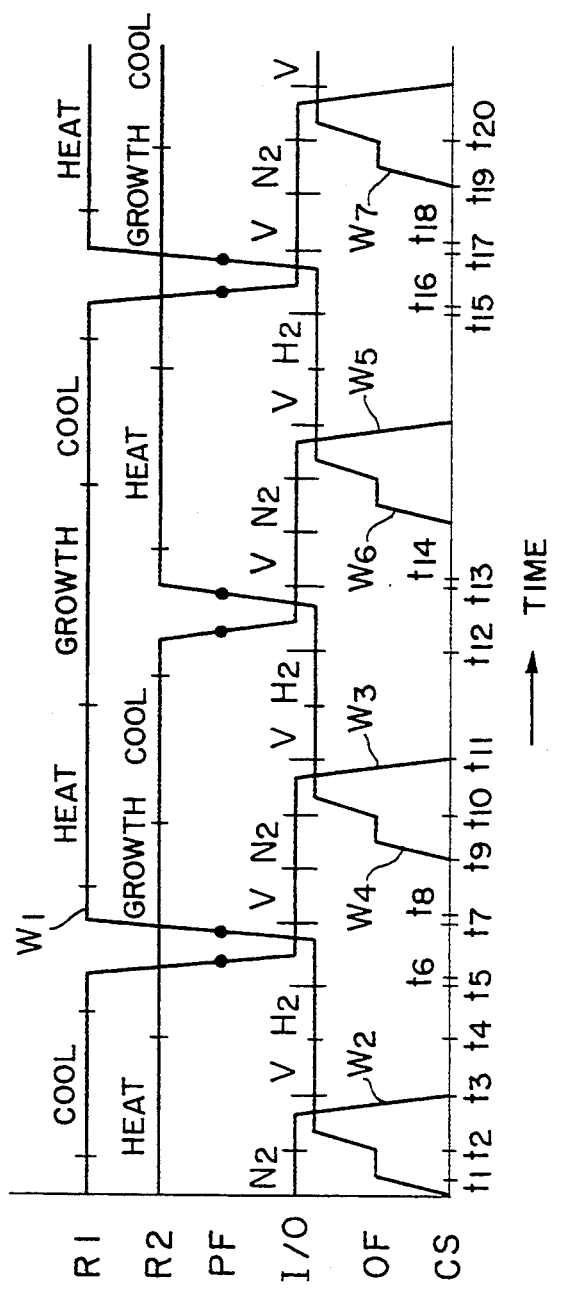
FIG. 7 is a diagram showing the wafer treating sequences of a first embodiment of a sheet after sheet type treating method according to this invention.
Figure 8:
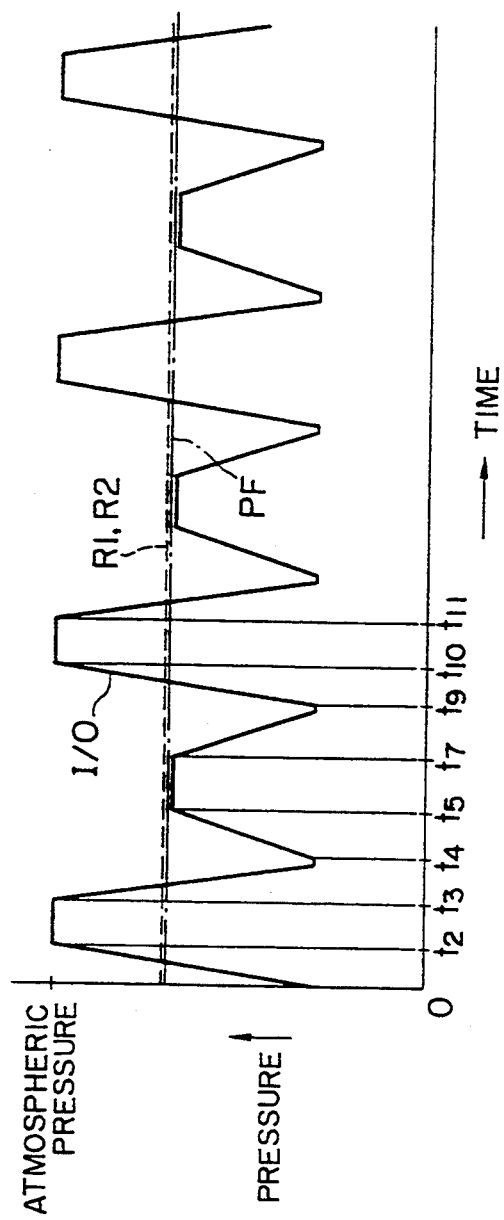
FIG. 8 is a diagram showing pressure sequences of respective treating chambers.

One example of the treating method effected by the sheet-after-sheet treating apparatus will now be described with reference to FIGS. 7 and 8. FIG. 7 shows a wafer treating sequence in which a semiconductor wafer W is dismounted from cassette 11a or 11b installed in the cassette station 10 (CS), then the wafer W is successively passed through the rotational positioning device 12 (OF), the inlet/outlet port 20 (I/O) and the platform 30 (PF) to reach one of the treating chambers 50a and 50b (R1 and R2). After treating the wafer in the treating chamber, the treated wafer W is returned again to cassette 11a or 11b, while FIG. 8 shows the pressure sequence in respective members I/O, PF, R1 and R2.

In FIG. 7 and following figures, $H_2$ designates a hydrogen purge, $N_2$ designates a nitrogen purge, and V designates an evacuation.

The treatment procedure of each semiconductor wafer W will be described with reference to the treatment of a reference semiconductor wafer W1. This wafer W1 is dismounted from cassette 11a and after being treated in treating chamber 50a (R1) the wafer is mounted on cassette 11a.

The semiconductor wafer W1 contained in one cassette 11a installed in the cassette station 10 (CS) is taken out by the external robot 13 and then mounted on the rotary positioning device 12 (OF) at time t1. At the same time, nitrogen gas is introduced into the inlet/outlet port 20 (I/O). When the pressure in the inlet/outlet port 20 becomes equal to the atmospheric pressure the first gate valve 21 is opened to communicate the inlet/outlet port 20 with the surrounding air at time t2. Concurrently with this communication, the semiconductor wafer W1 which has been mounted on the rotary positioning device 12 (OF) is transferred into the inlet/outlet port 20 (I/O) by the operation of the external robot 13.

Following this transfer, the already treated semiconductor wafer W2 in the inlet/outlet port 20 (I/O) is taken out with the external robot 13 and then mounted on a predetermined cassette 11b in the cassette station 10 (CS). Concurrently with this take out, the first gate valve 21 is closed at time t3, and the cassette station is evacuated to render its inside to a high degree of 10 (C/S) vacuum for times t3-t4. Then hydrogen gas is admitted, and when its pressure and atmosphere become equal to those in the platform 30 (RF), the second gate valve 31 is opened at time t5. When the treatment of a semiconductor wafer W3 in the treating chamber 50a (R1) is completed, the third gate valve 51a is opened at time t6.

Under these conditions the inlet/outlet port 20 (I/O) and the treating chamber 50a (R1) are intercommunicated through the platform 30 (RF). When the treating chamber 50a is opened, the semiconductor wafer W3 treated in the treating chamber 50a (R1) is conveyed to the inside of the inlet/outlet port 20 (I/O) from platform 30 (RF) by operating the vacuum robot 32. After the conveyance, a not yet treated semiconductor wafer W1 in the inlet/outlet port 20 (I/O) is transferred to the treating chamber 50a (R1) by the vacuum robot 32, and concurrently therewith, the second gate valve 31 is closed at time t7. After this transfer, the third gate valve 51a is closed at time t8.

By the operations described above, the treatment of the semiconductor wafer W1 in the treating chamber 50a (R1), that is heating, epitaxial growth, and cooling are performed. Meanwhile, in the inlet/outlet port 20 (I/O) conveyance of the wafer to the other treating chamber 50b (R2) is effected.

In the manner as above described, after closing the second gate valve 31, the inside of the inlet/outlet port 20 (I/O) is evacuated to a high degree of vacuum during times t7-t9. Then by admitting nitrogen gas at time t9 while purging particles in the inlet/outlet port 20 (I/O), the pressure in the port 20 is returned to atmospheric pressure, and then the first gate valve 21 is opened at time t10. Concurrently therewith, a not yet treated semiconductor wafer W4 on the rotary positioning device 12 (OF) is conveyed into the inlet/outlet port 20 (I/O), and the semiconductor wafer W3 already treated in the treating chamber 50a (R1) is taken out from the inlet/outlet port 20 (I/O) and then mounted on cassette 11a in the cassette station 10 (CS).

Concurrently with this taking out, the first gate valve 21 is closed at time t11, and after opening the second and third gate valves 31 and 50b in the same manner as above described, the not yet treated semiconductor wafer W4 and the semiconductor wafer W5 treated in the other treating chamber 50b (R2) are exchanged during times t12-t13. Thereafter, the third gate valve 51b is closed at time t14 for initiating the treatment of the semiconductor wafer W4 conveyed into the treating chamber 50b (R2). In the same manner as described above, an already treated semiconductor wafer W5 is accepted in cassette 11b of the cassette station 10 (CS), while a not yet treated semiconductor wafer W6 is accepted in the inlet/outlet port 20 (I/O).

In the same manner as above described, when the pressure and atmosphere in the inlet/outlet port 20 becomes equal to those in the platform 30 (PF), the second gate valve 31 is opened at time t15. After completion of the treatment of the semiconductor wafer W1 in the treating chamber 50a (R1), the third gate valve 51a is opened at time t16 for intercommunicating the treating chamber 50a (R1) and the inlet/outlet port 20 (I/O) through the platform 30 (PF). Under these conditions, after transporting already treated semiconductor wafer W1 in the treating chamber 50a (R1) into the inlet/outlet port 20 (I/O) by operating the vacuum robot 32, the not yet treated semiconductor wafer W6 contained in the inlet/outlet port 20 (I/O) is conveyed into the treating chamber 50a (R1). Then, the second and third gate valves 31 and 51a are sequentially closed at times t17 and t18.

After closing the third gate valve 51a the semiconductor wafer W6 conveyed into the treating chamber 50a (R1) is treated therein in the same manner as above described, and the inside of the inlet/outlet port 20 (I/O) is evacuated to a high degree of vacuum, and then at time t19 nitrogen gas is introduced into the inlet/outlet port 20, and after pressure in the inside of the inlet/outlet port 20 has returned to the atmospheric pressure, the first gate valve 21 is opened at time t20, and a not yet treated semiconductor wafer W7 is admitted into the inlet/outlet port 20, and the already treated semiconductor wafer W1 is transferred to the cassette 11a in the cassette station 10 for completing the treating of the semiconductor wafer W1.

In the foregoing embodiment, the pressure in the platform 30 is made to be equal to the treating pressure in the treating chambers 50a and 50b and only the pressure in the inlet/outlet port 20 is varied. However, according to this method, the pressure in the treating chambers 50a and 50b is the same as that of the time of admitting and taking out the semiconductor wafer W and that during the epitaxial growth, so that there is no variation in the pressure. As a result, particles formed in the treating chambers 50a and 50b do not rise. Accordingly, adhesion of the particles to the semiconductor wafer W can be reduced greatly.

The pressure in the inlet/outlet port 20 is repeatedly changed from the atmospheric pressure and a reduced pressure, but since there is no movable body in the inlet/outlet port 20 there is no source of generating particles. Moreover, since the volume of the inlet/outlet port 20 is relatively small, and since the construction of the inlet/outlet port 20 is simple to permit insertion of a single semiconductor wafer W from outside, the particles sent from outside can readily be discharged at the time of evacuation or at the time of substituting hydrogen gas. Moreover, as the ratio of the volume of platform 30 to that of the inlet/outlet port 20 is small, it is possible to limit to a small value the variation of the pressure and atmosphere in the platform 30. In addition, since there is no pressure variation in the platform 30 as well as the treating chambers 50a and 50b, particles would not rise.

The movable parts of the vacuum robot 32 used in the foregoing embodiments are perfectly sealed so that substantially no particles are generated even when the robot 32 is used in a vacuum.

In this method, the degree of cleanness was measured. The result was 0.1 μm class 10. This result shows that this method can be used for manufacturing LSIs.

Figure 9:
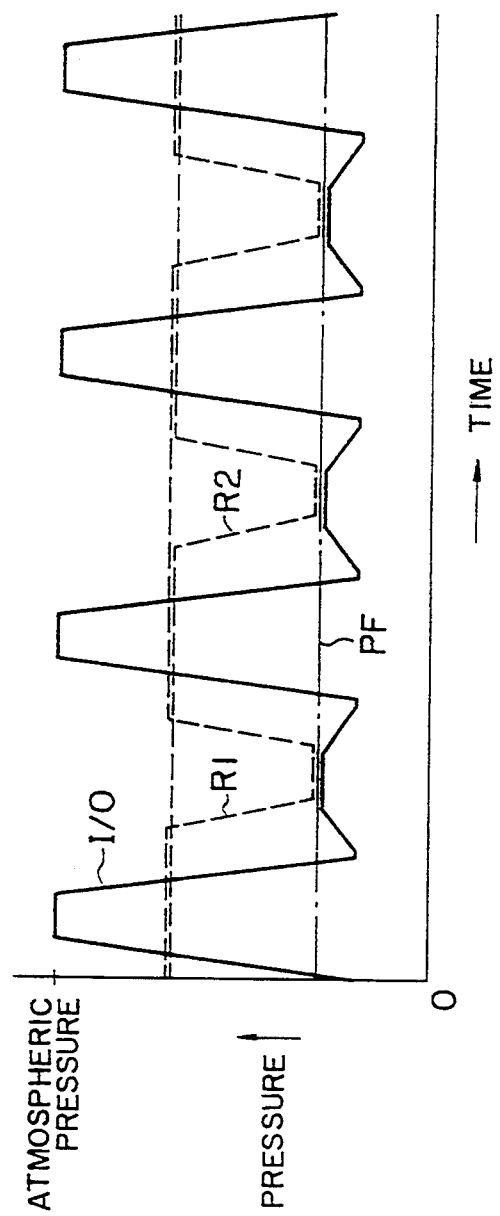
FIG. 9 is a diagram showing pressure sequences of respective treating chambers of a second embodiment of this invention.

FIG. 9 shows a pressure sequence in respective chambers of the second embodiment of this invention wherein the degree of vacuum in the platform 30 is increased and the wafer W is exchanged between the platform 30 and respective treating chambers 50a and 50b. In this case, the degree of vacuum in the platform 30 (PT) is set to a pressure two orders of magnitude lower (that is a high degree of vacuum) than the treating pressure (several tens torr) in the treating chambers 50a and 50b (R1, R2). Then the pressure in the treating chambers 50a and 50b is increased to the pressure in the platform 30, and then the semiconductor wafer W is exchanged under this condition.

More particularly, at the time of intercommunicating the inlet/outlet port 20 (I/O) and the platform 30 (PF) by opening the second gate valve 31, the pressure in the inlet/outlet port 20 is made to be equal to that in the platform 30 (PF) (that is a high degree of vacuum). Further, the pressure in the treating chamber 50a or 50b (R1 or R2) is made to be equal to a high degree of vacuum equal to the pressure in the platform 30 (RF) in an interval between completion of treatment and opening of the third gate valve 51a or 51b. Under these conditions, the semiconductor wafer W is exchanged between the platform 30 (PF) and the treating chamber 50a or 50b (R1 or R2). Further, after closing the third gate valve 51a or 51b, the pressure in the treating chamber 50a or 50b (R1 or R2) is restored to the treating pressure before commencing treatment.

According to this method, although the pressure in the treating chambers 50a and 50b varies, since the pressure is reduced after treatment, it becomes easy to exchange the atmosphere in the treating chambers 50a and 50b. Further, it is possible to prevent contamination of the treating chambers 50a and 50b caused by passing various gases therethrough.

In the foregoing embodiments, where the first and second gate valves 21 and 31 are both closed, only one of the semiconductor wafer W, not yet treated or has treated, is contained in the inlet/outlet port 20. For this reason, the pretreatment including such purifying treatment as baking and ultraviolet ray irradiation and such post treatment as heat treatment of the wafer can be accurately made in a sheet-after-sheet mode.

Figure 10:
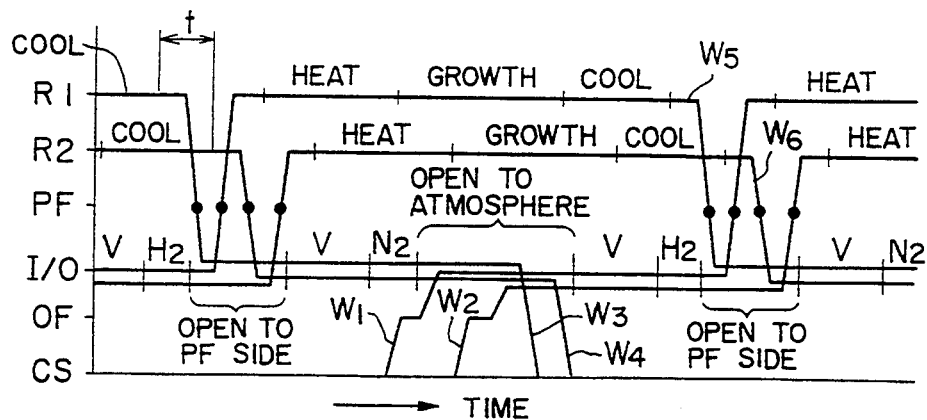
FIG. 10 is a diagram showing wafer treating sequences of a third embodiment of this invention.

FIG. 10 shows the operation of the third embodiment of this invention wherein treating times in treating chambers 50a and 50b are displaced by an interval t, two semiconductor wafers are exchanged between the cassette station 10 (C/S) and the inlet/outlet port 20 (I/O) and wherein two not yet treated semiconductor wafers W contained in the inlet/outlet port 20 (I/O) are exchanged with two already treated semiconductor wafers W in the treating chambers 50a and 50b at different times spaced apart by t.

More particularly, in a state in which the first gate valve 21 has opened, the semiconductor wafer W1 contained in one cassette 11a of the cassette station 10 (CS) is transferred from the rotary positioning device 12 (OF) into the inlet/outlet port 20 (I/O). Then the semiconductor wafer W2 contained in the other cassette 11b is successively transferred into the inlet/outlet port 20 (I/O) from the rotary positioning device 12 (OF).

Furthermore, an already treated semiconductor wafer W3 which has been treated in one treating chamber 50a (R1) and has been contained in the inlet/outlet port 20 (I/O) is transferred to the cassette 11a of cassette station 10 (CS). Then the other semiconductor wafer W4 which has been treated in the other treating chamber 50b (R2) and has been contained in the inlet/outlet port 20 (I/O) is transferred to cassette 11b.

Under these conditions, the first gate valve 21 is closed, and evacuation and hydrogen purge are performed. When the pressure and atmosphere in the platform 30 (PF) become equal to the inlet/outlet port 20, the second gate valve 31 is opened. Then the third gate valve 51a of one treating chamber 50a (R1) in which the treatment of the semiconductor wafer W5 has completed, is opened. Then, after an interval t, the other third gate valve 51b of the other treating chamber 50b (R2) in which the treatment of the wafer has been completed, is opened for exchanging a treated semiconductor wafer W6 with a not yet treated semiconductor wafer W2 in the inlet/outlet port 20 (I/O).

After each exchange of the wafers, the third gate valves 51a and 51b are sequentially closed for respectively treating semiconductor wafers W1 and W2 in respective treating chambers 50a and 50b (R1, R2). After completion of this treatment, the treated semiconductor wafers W1 and W2 are sequentially conveyed to the inlet/outlet port 20 (I/O) and then received in respective cassettes 11a and 11b.

In this embodiment, although it is necessary to provide four supporting members for supporting the materials to be treated, that is wafers, it becomes possible to lengthen the time required for changing the pressure and atmosphere in the inlet/outlet port 20 (I/O).

Figure 11:
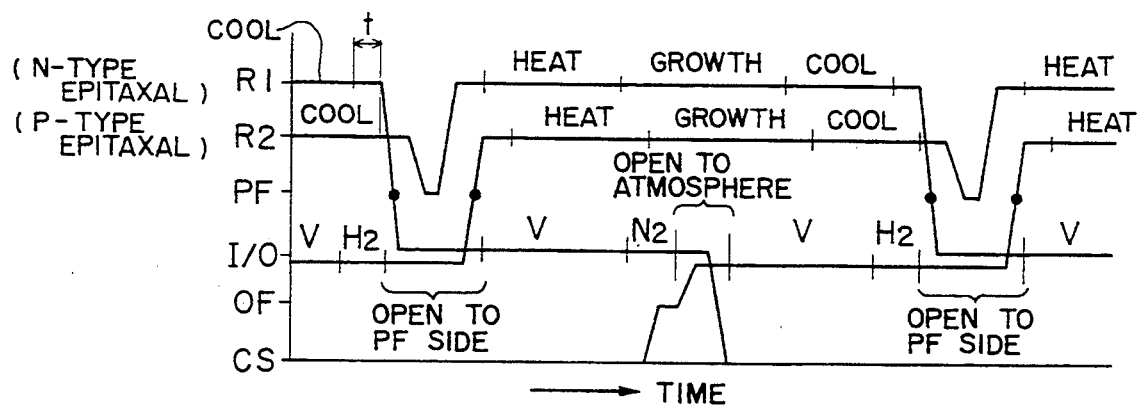
FIG. 11 is a diagram showing wafer treating sequences of a fourth embodiment of this invention.

FIG. 11 shows the fourth embodiment of this invention wherein one treating chamber 50a (R1) is used for the N type epitaxial growth, and the other treating chamber 50b (R2) is used for the P type epitaxial growth so as to enable continuous treatment of the P type epitaxial growth and the N type epitaxial growth.

More particularly, in this embodiment the N type epitaxial growth treatment in the treating chamber 50a (R1) and the P type epitaxial growth treatment in the treating chamber 50b (R2) are dephased by an interval t. After completing the treating in the treating chamber 50a (R1), the second and the third gate valves 31 and 51a are opened, the semiconductor wafer W whose N type epitaxial growth has been completed is conveyed to the inlet/outlet port 20 (I/O). Then, after an interval t the third gate valve 51b connected to the treating chamber 50b (R2) is opened for transferring the semiconductor wafer W whose N type epitaxial growth has been completed to a vacant treating chamber 50a (R1) via the platform 30 (PF). Further, a not yet treated semiconductor wafer W which has been contained in the inlet/outlet port (I/O) is transferred into the treating chamber 50b (R2).

After respective transfers, the third gate valves 51a and 51b are sequentially closed for performing respective treatments of the semiconductive wafers W in respective treating chambers 50a and 50b (R1, R2).

Figure 12:
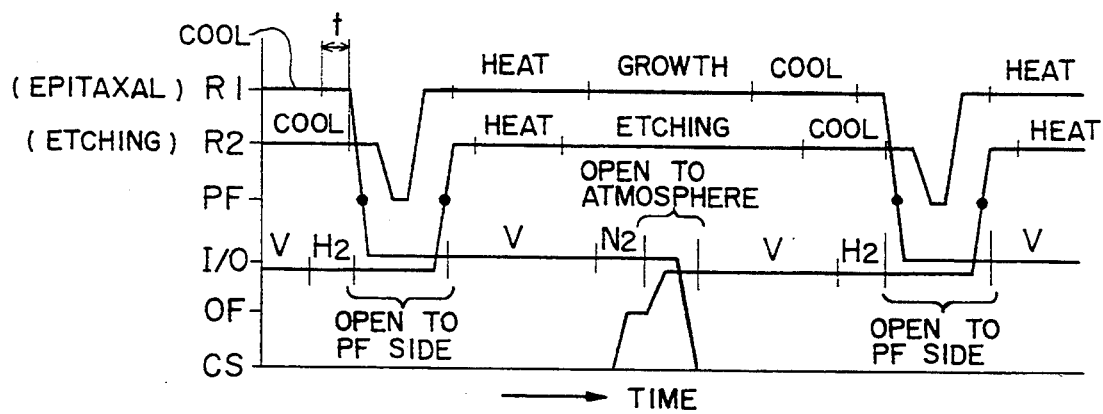
FIG. 12 is a diagram showing wafer treating sequences of a fifth embodiment of this invention.

FIG. 12 is a graph showing the fifth embodiment of this invention wherein one treating chamber 50a (R1) is used for etching and the other treating chamber 50b (R2) is used for the epitaxial vapor phase growth for continuously performing a series of treatments consisting of the etching treatment and the epitaxial vapor phase growth treatment.

More particularly, in this embodiment, the P type epitaxial vapor phase growth of the foregoing embodiment is changed to the epitaxial vapor phase growth, and the N type vapor phase growth is changed for etching.

Since the apparatus of this invention has a construction described above, it is possible to convey the material to be treated between the inlet/outlet port and the outside during the treatments in respective treating chambers whereby the working efficiency can be improved without interrupting the treatment in the treating chambers for putting into and taking out the material.

Moreover it is possible to make the volume small and to simplify the configuration of the inlet/outlet port liable to receive particles from outside. Moreover, since there is no source of forming particles in the inlet/outlet port, the degree of cleanness in the inlet/outlet port can be improved so that the contamination of the platform caused by the particles flowing thereinto from the inlet/outlet port can be prevented, thus ensuring an accurate treatment of less contamination.

Further, the material to be treated is conveyed into the inlet/outlet port, one after one, so that it is only necessary to contain at least one material in the inlet/outlet port so that it is possible to greatly decrease the number of rejects even when unexpected trouble occurs in the apparatus.

Further, miniaturization of the volume and simplification of construction of the inlet/outlet port, especially small volume of the inlet/outlet port in which pressure or atmosphere greatly changes contribute to a compact exhaust system.

What is claimed is:

1. A sheet-after-sheet type treating method utilizing a multichamber sheet-after-sheet type treating apparatus including an inlet/outlet port capable of communicating with surrounding air through a first inlet/outlet port gate valve, which is independently controllable to maintain said inlet/outlet port at a predetermined pressure or at a pressure of said surrounding air; a platform connected to said inlet/outlet port via a second inlet/outlet port gate valve, which is independently controllable to maintain said platform at said predetermined pressure; a plurality of treating chambers respectively connected to said platform through corresponding treating chamber gate valves, which are independently controllable to maintain said treating chambers at said predetermined pressure; and a robot installed in said platform for exchanging materials to be treated between said inlet/outlet port and said respective treating chambers; said method comprising:

a first exchanging step for exchanging a first treated material in a first treating chamber with a first untreated material in said inlet/outlet port while said treating chambers other than said first treating chamber are treating corresponding materials, said first exchanging step comprising the steps of:

making substantially equal said pressure in said inlet/outlet port to said predetermined pressure of said platform;

opening a first treating chamber gate valve interconnecting said first treating chamber and said platform after completion of treatment in said first treating chamber and while said first inlet/outlet port gate valve is closed;

opening said second inlet/outlet port gate valve;

removing said first treated material from said first treating chamber and placing said first treated material in said inlet/outlet port;

removing said first untreated material from said inlet/outlet port and placing said first untreated material in said first treating chamber;

closing said first treating chamber gate valve; and closing said second inlet/outlet port gate valve;

a second exchanging step for exchanging said first treated material in said inlet/outlet port with a second untreated material from said surrounding air, said second exchanging step comprising the steps of:

making substantially equal said pressure in said inlet/outlet port to said surrounding air;

opening said first inlet/outlet port gate valve;

removing said first treated material from said inlet/outlet port and placing said first treated material in said surrounding air;

removing a second untreated material from said surrounding air and placing said second untreated material in said inlet/outlet port; and closing said first inlet/outlet port gate valve; and repeating said first and second exchanging steps for each of said plurality of treating chambers for sequentially treating said corresponding materials in said plurality of treating chambers.

2. A sheet-after-sheet type treating method as recited in claim 1 wherein treatments in said treating chambers are identical, and treating timings are displaced from each other by 1/n (n=number of treating chambers), and wherein exchange of said material to be treated is made to correspond with the treating timings in said treating chambers.

3. A sheet-after-sheet type treating method as recited in claim 1, wherein said surrounding air contains a plurality of untreated materials which are oriented in rotational alignment.

* * * * *